United States Patent [19]

Wu et al.

[11] Patent Number: 5,585,012

[45] Date of Patent: Dec. 17, 1996

[54] SELF-CLEANING POLYMER-FREE TOP ELECTRODE FOR PARALLEL ELECTRODE ETCH OPERATION

[75] Inventors: Robert Wu, Pleasanton, Calif.; Hyman J. Levinstein, Berkeley Heights, N.J.; Hongching Shan, San Jose, Calif.

[73] Assignee: Applied Materials Inc., Santa Clara, Calif.

[21] Appl. No.: 357,622

[22] Filed: Dec. 15, 1994

[51] Int. Cl.⁶ ...................................................... H05H 1/00
[52] U.S. Cl. .......................... 216/71; 156/643.1; 156/345; 134/1.1; 204/298.34
[58] Field of Search ................................ 156/345, 643.1; 134/1.1; 216/71; 204/298.34

[56] References Cited

U.S. PATENT DOCUMENTS

| | | | |
|---|---|---|---|
| 4,786,392 | 11/1988 | Kruchowski et al. | 156/345 X |
| 5,006,192 | 4/1991 | Deguchi | 156/345 |
| 5,252,178 | 10/1993 | Moslehi | 156/345 X |
| 5,259,922 | 11/1993 | Yamano et al. | 156/643.1 |
| 5,269,881 | 12/1993 | Sekiya et al. | 156/345 X |

FOREIGN PATENT DOCUMENTS

| | | | |
|---|---|---|---|
| 76434 | 4/1988 | Japan | 156/345 |
| 221620 | 9/1988 | Japan | 156/345 |
| 100925 | 4/1989 | Japan | 156/345 |
| 253238 | 10/1989 | Japan | 156/345 |

*Primary Examiner*—Thi Dang
*Attorney, Agent, or Firm*—Peter J. Sgarbossa; Noel F. Heal

[57] ABSTRACT

A plasma etch reactor and a related method of its operation to provide self-cleaning of its top electrode, which is subject to being coated by polymer deposits during normal operation. In one form of the invention, radio-frequency (rf) power is applied to the top electrode on a continuous basis, but at a much lower power level than that of a primary rf power source used to supply power through a lower electrode, to generate and sustain a plasma in the reactor. The small rf power applied through the top electrode is selected to be of such a level as to remove deposits from the electrode continuously, as they are formed, but without removing any significant amount of electrode material. In another form of the invention, power is applied to the top electrode periodically during cleaning periods and power supply to the lower electrode is suspended during the cleaning periods. The two cleaning approaches may also be combined, with continuous cleaning being supplemented with occasional or periodic dry cleaning while etch processing is suspended.

9 Claims, 3 Drawing Sheets

SELF-CLEANING POLYMER-FREE TOP ELECTRODE FOR PARALLEL ELECTRODE ETCH OPERATION

BACKGROUND OF THE INVENTION

This invention relates generally to plasma etch reactors and, more particularly to techniques for controlling microcontamination and the scavenging effect in such reactors. In a dry etching process typically used in the fabrication of integrated semiconductor devices, process gases are supplied to a reactor chamber and radio-frequency (rf) energy generates and sustains a plasma cloud within the chamber. Ions in the plasma cloud bombard a workpiece, which is usually a semiconductor wafer located in the chamber immediately adjacent to the plasma, or in a separate processing chamber into which ions from the plasma are drawn. The ions either etch the workpiece or assist the etching, and the etching process may be made selective by patterning a protective coating applied to the workpiece prior to etching. Selective etching requires the etch process to proceed at different rates for different materials, such as when a substrate material is etched in preference to a masking material. Some plasma particles, such as fluorine atoms, are notoriously non-preferential and spontaneously react with silicon and silicon dioxide, which is a common masking material. One solution to this difficulty is to use silicon as a scavenging electrode material, to absorb free fluorine in the plasma and thereby improve selectivity. However, an inherent difficulty with this process is that the scavenging effect is progressively reduced as the surface of the silicon electrode becomes coated with polymer materials or with by-products of the reaction with fluorine.

In general, there are three types of plasma generation approaches: capacitive, inductive, and microwave. In the more conventional capacitive plasma approach, the plasma is formed between a pair of parallel plate electrodes, to which radio-frequency (rf) power is applied, to one or both plates. A variant of the parallel plate approach is the magnetically enhanced reactive ion etch (MERIE) plasma generation apparatus, in which a magnetic field enhances the formation of ions in the plasma. Inductive plasma generators use an inductive coil, either a planar coil, a cylindrical coil or any of various other types of coils to deliver rf power into the plasma chamber. A separate rf generator supplies energy to at least one plate electrode in the chamber, to control ion energy and direction.

In a reactor chamber having a grounded upper electrode, referred to as the anode, the surface of the anode, including the exposed surface of the chamber, which is also grounded, is usually much larger than the surface of the lower electrode, the cathode. This results in a large direct current (dc) bias on the cathode and improves the plasma energy and the etch rate. However, the anode surface collects a polymer deposit during etching and the deposit can be a significant source and/or root cause of particle contamination. The deposit could also significantly affect the process conditions since the accumulated polymer alters the rf return impedance. In some reactors, this deposit could change the reaction chemistry, particularly the etch reaction, which depends upon the material of the top electrode. The mechanism resulting in particle contamination is not completely understood but may be explained as follows. As the polymer layer gets thicker, return rf current, which is normally distributed uniformly over the entire anode surface, flows instead through regions that are not coated with polymer. The only areas that have no polymer depositions are gas inlet holes in the anode, which serve to introduce process gases into the chamber. Increased current density around the gas holes provides a "current crowding effect" in those areas and electrical arcing may take place. The arcing produces molten aluminum particles. Particle contamination, either in the form of these aluminum particles or in the form of polymer flakes, is a likely result if the polymer layer becomes thick enough between cleanings. In configurations in which the top electrode has no gas inlet holes, the polymer deposition could significantly change the electrode surface chemistry reaction rate. As a result, the etch performance, such as selectivity or etch rates, may drift and cause production problems.

The conventional solution to this problem is to perform an in-situ dry cleaning process periodically, such as after processing each wafer or twenty-five wafers. For an oxide etching process, such dry cleaning is effective in controlling polymer deposition, eliminating gas hole arcing, controlling particle contamination and stabilizing etch performance, but is not without cost. Dry cleaning reduces processing through-put, increases the difficulty of automating processing, and shortens the useful life of "process kits," i.e., replaceable components installed in the chamber.

A similar problem arises in relation to an existing power-splitting version of a reactive ion etch chamber. In this device, the upper and lower electrodes are placed relatively close together and rf power from a single source is split equally between the electrodes, and applied with a phase difference of 180°. This arrangement confines the resulting plasma between the electrodes but also results in erosion of the upper electrode, and consequently a shortened useful life of the electrode.

It will be appreciated from the foregoing that there is still a need for improvement in plasma etch techniques. Ideally, what is needed is a plasma etch system that avoids the problems outlined above and, in particular, a system that minimizes or avoids off-line dry cleaning to remove deposits from the top electrode, but does not result in substantial erosion of the electrode. The present invention satisfies this need.

SUMMARY OF THE INVENTION

The present invention provides a plasma processing system, such as a reactive ion etching system that uses a relatively small amount of rf power to be applied directly to an electrode to perform a self-cleaning function. Briefly, and in general terms, the apparatus of the invention comprises a reactor chamber; a first electrode located in the chamber; a second electrode spaced apart from the first electrode, for supporting a workpiece to be processed in the reactor chamber; at least one inlet port for supplying process gases to the reactor chamber; at least one outlet port for evacuating gases from the chamber; a first high-frequency power source connected between the second electrode and ground, to generate and sustain a plasma in the reactor chamber; and a second high-frequency power source, not necessarily of the same frequency as the first high-frequency power source, connected to the first electrode to supply power to the first electrode. The power applied to the first electrode is usually at a low level relative to the power supplied by the first high-frequency power source, and is selected to effect self-cleaning of the first electrode without significantly removing electrode material. The second high-frequency power source is connected in such a manner as not to interfere with power supplied by the first high-frequency power source. In a preferred embodiment, the plasma etch reactor also includes a coupling capacitor. The second high-frequency power source has one terminal grounded and the other terminal coupled to the first electrode through the capacitor. The second high-frequency power source and the capacitor provide a virtual ground path for power supplied from the first high-frequency power source.

In another aspect, the invention includes a plasma etch reactor with an electrode cleaning mechanism, comprising a reactor chamber; a first electrode located in the chamber; a second electrode spaced apart from the first electrode, for supporting a workpiece to be processed in the reactor chamber; at least one inlet port for supplying process gases to the reactor chamber; at least one outlet port for evacuating gases from the chamber; a high-frequency power source connected between the second electrode and ground, to generate and sustain a plasma in the reactor chamber; and a circuit for connecting high-frequency power to the first electrode for cleaning deposits from the first electrode. In a preferred embodiment, the circuit for connecting high-frequency power to the first electrode operates periodically and includes a control circuit for simultaneously disconnecting power from the second circuit. In another embodiment, the circuit for connecting high-frequency power to the first electrode includes a second high-frequency power source of much lower power than the originally recited high-frequency power source and a circuit for connecting the second high-frequency power source to the first electrode while the plasma etch reactor is in normal operation and is receiving power from the first recited high-frequency power source. The two embodiments may be combined such that the second high-frequency power source performs continuous cleaning of the first electrode during normal operation and periodic cleaning is also performed by applying power to the first electrode only.

In still another aspect, the invention includes the steps of supplying process gases to a plasma etch reactor chamber; supplying high frequency power between a first electrode and a second electrode in the chamber, to generate and sustain a plasma in the chamber; pumping used process gases from the chamber; and applying high-frequency power to the first electrode to clean deposits therefrom and to reduce or eliminate the need for off-line dry cleaning of the first electrode. In one embodiment of the method, the step of applying high frequency power to the first electrode includes connecting power to the first electrode from a separate high-frequency power source of any selected frequency and of substantially lower power than is used to supply power to the second electrode. The power applied to the first electrode increases ion energy in the plasma and is selected to produce continuous cleaning of deposits from the first electrode without significant removal of electrode material.

In accordance with another aspect of the method, the step of applying high-frequency power to the first electrode further includes periodically suspending application of power to the second electrode; simultaneously increasing power applied to the first electrode for a selected time to effect accelerated cleaning of deposits from the first electrode; resuming application of power to the second electrode; and resuming application of reduced high-frequency power to the first electrode to resume continuous cleaning of the first electrode.

It will be appreciated from the foregoing that the present invention represents a significant advance in the field of plasma etching. In particular, the invention fulfills a long felt need for the reduction or elimination of the time taken to clean polymer deposits from a top electrode of a plasma etch reactor. Other aspects and advantages of the invention, such as effective scavenging control, will become apparent from the following more detailed description of the invention, taken in conjunction with the accompanying drawings.

DESCRIPTION OF THE PREFERRED EMBODIMENT

The present invention is concerned with apparatus and methods which avoid or minimize the need to clean electrodes within plasma reactor systems, such as plasma etch systems. Etch systems of this type, for example, may be provided in several configurations. One type of configuration processes substrates, such as semiconductor wafers, in single wafer reactor chambers. another configuration processes substrates in batches held together within a main reaction chamber. Regardless of configuration, the reaction chamber is provided with cathode and anode electrodes to facilitate the application of rf power within the chamber in order to generate, sustain or control a plasma from process gases within the chamber.

In this description, the term "wafer" will be used to refer to the workpiece, but it will be understood that the invention is not limited to workpieces that are semiconductor wafers. The workpieces may be any items subject to processing in a plasma chamber, such as single or multiple semiconductor wafers, or flat panels on which thin-film transistors (TFTs) are formed. Moreover, although the invention is described in the context of an etch process, it may be used with any plasma process that results in unwanted depositions on one of the electrodes.

In typical single wafer reactors, the electrodes are provided as a lower electrode (normally the cathode) upon which a workpiece, such as a semiconductor wafer, rests horizontally, and an upper electrode (normally the anode) spaced above the cathode. Normally rf power is applied to the cathode while the anode is grounded. During plasma processing, polymer deposits from the plasma, and ultimately from elements of the process gases and the materials of the wafer, typically form on the grounded electrode, periodically requiring processing of the wafer to be interrupted for a dry cleaning process to remove the deposits. Without timely removal, the deposits may flake off, causing particulate contamination; or they may cause drifting of the process rates, and unstable etch selectivity characteristics in the wafers being processed.

Other electrode configurations are also possible, in both single wafer reactors and in batch-type reactors, for example electrodes which are oriented side-by-side. Although the illustrative embodiment described below is in the context of a single wafer reactor, it will be understood that similar polymer deposit problems can be experienced regardless of electrode configuration, and that the invention is equally applicable to reactors in which the anode and cathode electrodes are provided in other spatial configurations, such as side by side.

Figure 1:
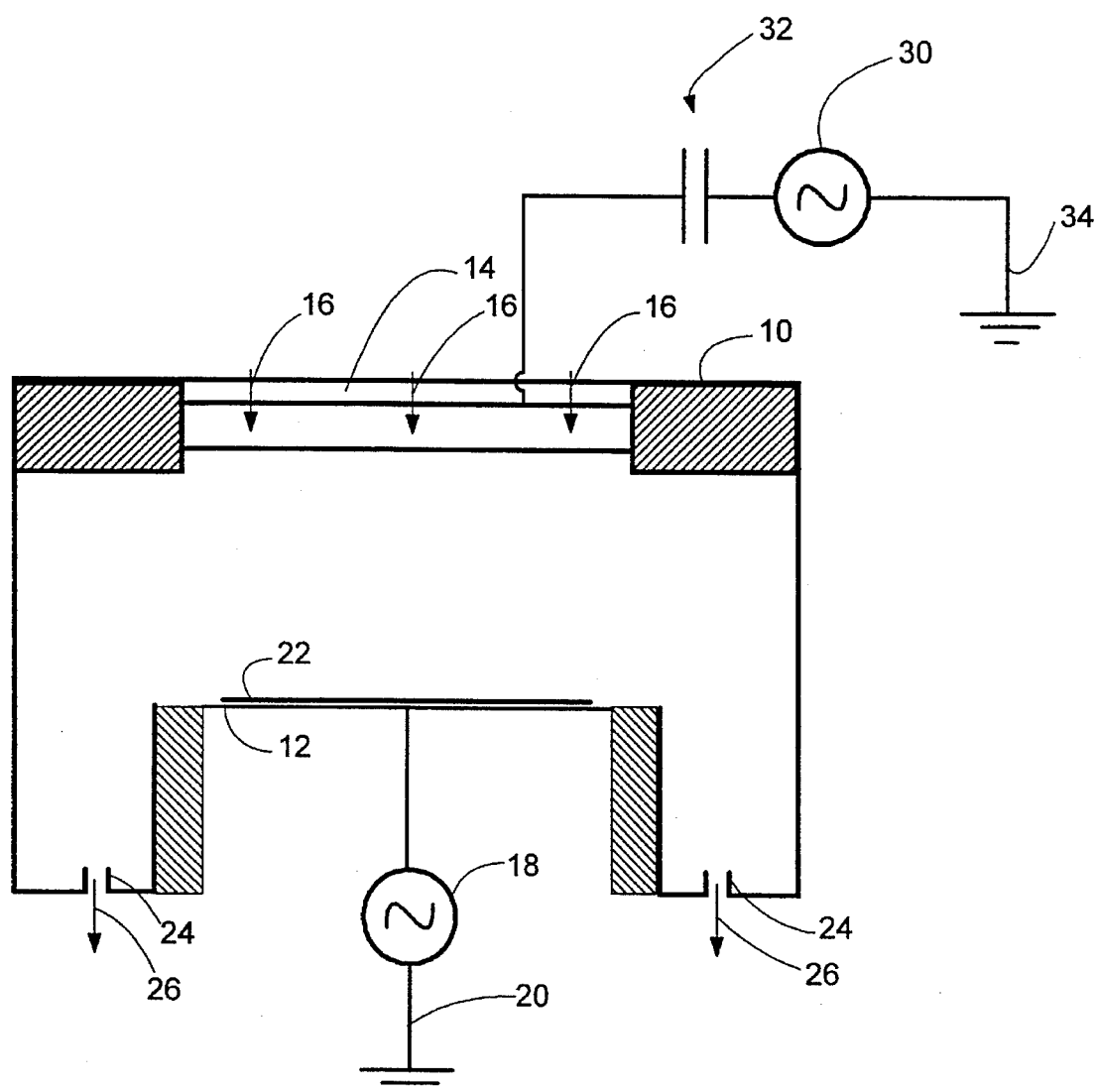
FIG. 1 is a diagrammatic view of a plasma etch reactor in accordance with the invention.

In accordance with one aspect of the invention, a relatively small amount of rf power of any selected frequency is applied to one electrode, typically the top electrode in a single-wafer reactor, for a continuous self-cleaning effect. Alternatively, or in addition, a larger amount of rf power is applied to the top electrode on a periodic basis for a more rapid off-line dry cleaning effect. As shown in FIG. 1, a conventional single-wafer reactive ion etch chamber, indicated by reference numeral 10, has a lower electrode 12 (the cathode), and an upper electrode 14 (the anode.) Process gases are introduced into the chamber 10, typically through openings (not shown) in the upper or top electrode 14, as indicated diagrammatically by the arrows 16. Power is applied to the lower electrode 12, as indicated by rf generator 18, which has one terminal connected to the lower electrode and the other electrode grounded, as indicated at 20. In this configuration, both the lower electrode 12 and the upper electrode 14 are electrically isolated from the walls of the chamber 10. A plasma is generated and sustained by the rf power applied to the lower electrode 12, which becomes self-biased to some negative level (typically several hundred volts) with respect to the plasma. Positive ions in the plasma are accelerated toward the lower electrode 12 as a result of this dc bias, and etch a semiconductor wafer 22 secured to the electrode by conventional means, which may include a mechanical clamp or an electrostatic chuck. Gases are exhausted from the chamber 10 by conventional vacuum pumps (not shown), as indicated by exhaust ports 24 at the bottom of the chamber and directional arrows 26.

The power sustaining the plasma may be provided either through capacitive coupling via the electrodes, or at least in part by induction in which the sustaining rf power is coupled into the plasma via an inductive coil adjacent to the reaction volume, or via microwave coupling. Even when the power applicator is primarily a coil or waveguide, electrodes may be used to deliver some power, particularly for control purposes, for example to control ion energy and direction.

In such cases, the electrodes may be prone to troublesome deposits. For example, in plasma etching as described above, an undesirable by-product will be polymer deposits on an electrode, which, in the case of the FIG. 1 single wafer chamber, is the top electrode 14. These have to be removed in situ or periodically in an off-line cleaning process that detracts from the processing efficiency of the plasma etching system.

In accordance with one aspect of the invention, a relatively small rf power is applied to the top electrode 14 to provide a self-cleaning effect. For this purpose, the apparatus of the invention further includes a separate rf generator 30, one terminal of which is coupled to the top electrode 14 through a capacitor 32. The other terminal of the second rf generator 30 is grounded, as indicated at 34. The amount of power provided by the additional rf generator 30 is usually on the order of one-tenth the power provided by the primary rf generator 18. The coupling capacitor 32 ensures that there is no interference with the primary rf generator 18. Typically, the primary rf generator frequency is 13.56 MHz. If the frequency of the additional rf generator 30 is chosen to be, for example, 400 kHz, the top electrode 12 is a virtual ground for the primary rf generator 18, which "sees" a relatively low impedance presented by the coupling capacitor 32. As is conventional in plasma reactors, the surface area of the lower electrode 12 (cathode) is considerably smaller than the equivalent surface area of the upper electrode 14 (anode), including the grounded walls of the chamber 10. As a result of this asymmetry in electrode areas, a much smaller negative bias develops between the anode 12 and the plasma, than develops between the cathode 14 and the plasma. As a result, a negative dc bias (typically of 200–500 v) develops between the cathode 14 and the plasma. The dc bias leads to preferential positive ion bombardment of the cathode 14 in a plasma etch process, and only minimal removal or "sputtering" of the anode material. The presence of the capacitor 32 ensures that the primary rf generator 18 still "sees" the anode as being virtually grounded, along with the walls of the chamber 10, so that the asymmetry of electrode surface areas is maintained and a desired dc bias is still developed on the cathode 14. However, both electrodes 12 and 14 are electrically insulated from the walls of the chamber 10. Because of its normally lower frequency, the additional rf generator 30 "sees" the capacitor 32 as having a larger impedance, and a selected smaller level of power is coupled to the plasma through the upper electrode (anode) 14. A return ground path for rf power from the additional rf generator 30 is provided through the cathode 12 and primary generator 18, as well as through the grounded walls of the chamber 10. Depending on design details, the primary rf generator 18 may also be capacitively coupled to the cathode 12 and may include impedance matching circuitry (not shown).

The power requirement for self-cleaning of the top electrode 14 is determined in part by the material of the electrode and the particular etch process being used. In a high selectivity plasma environment, the top electrode 14 is sometimes made of silicon for a scavenging effect, to remove fluorine atoms from the plasma and thereby improve selectivity because fluorine reacts spontaneously both with silicon and with other silicon compounds, such as silicon dioxide, which is a commonly used mask material in semiconductor fabrication. It is possible to keep the surface of a silicon anode clean by heating it to above 90° C. or applying 50–200 W of rf power, or both. In the case of metal etching, a pure aluminum electrode can be used.

Figure 2:
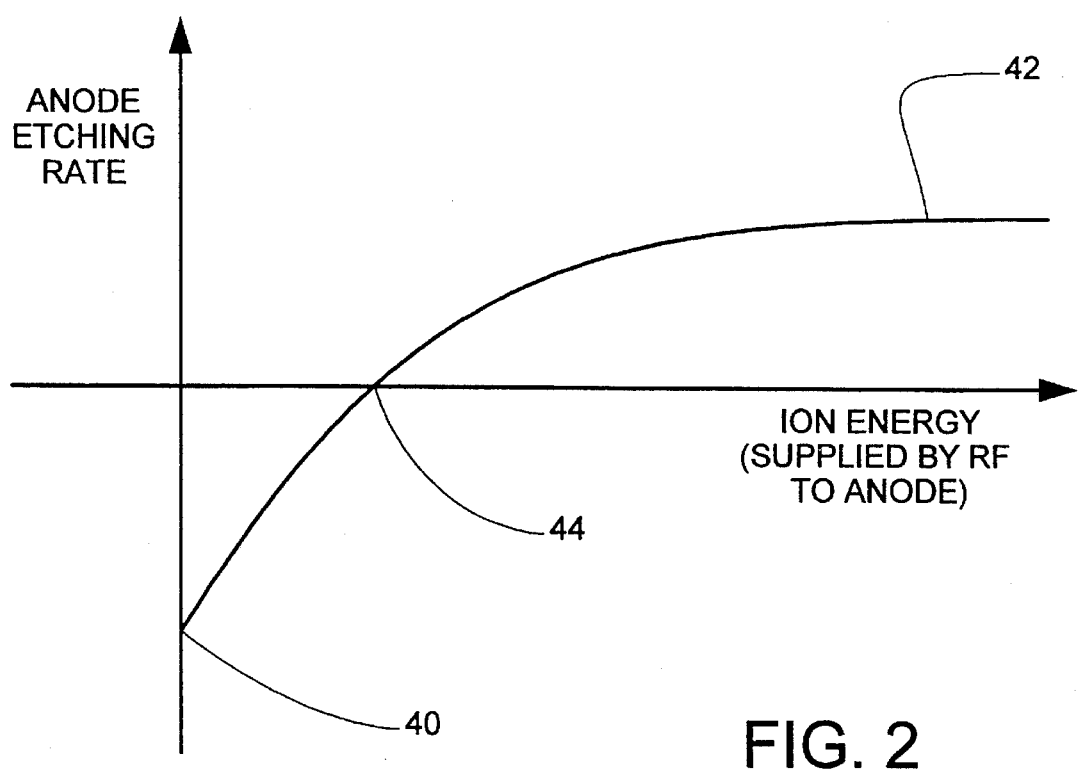
FIG. 2 is a graph showing the variation of top electrode etch rate with plasma ion energy.

In general, the relationship between anode etching (or deposition) rate and ion energy supplied through the anode is shown in graphical form in FIG. 2. When no additional rf energy is coupled through the anode, the situation is that of a conventional RIE system. The anode becomes deposited with polymer material, as previously discussed and as indicated by the point 40 in the graph. When a large amount of energy is supplied through the anode, as in a balanced configuration in which rf energy is split equally between the upper and lower electrodes, material is removed from the anode, as indicated at point 42 in the graph. In the present invention, the primary goal is to provide for no net deposition or removal of anode material. This goal may be achieved by supplying sufficient rf power to the anode 14 to reach point 44 in the graph. Material deposited on the anode is removed continuously in the cleaning action provided by the rf power from the additional generator 30. As a result of keeping the top electrode surface clean, if a silicon or other reactive material is used, the surface reaction rate can be controlled to provide a repeatable scavenging effect, whereby surface anode material is continuously or periodically removed by applying power to the anode to etch the deposited material away. Removing polymers, as well as products of reaction of silicon and fluorine, leaves pure silicon exposed at the anode surface and maintains the scavenging effect.

As briefly alluded to in the preceding paragraph, another possible method of operation of the invention is to clean the top electrode 14 on a periodic, rather than continuous, basis by applying sufficient power periodically to the top electrode. Applying power to the top electrode for a dry cleaning step is more effective than applying the power to the lower electrode 12, so the dry cleaning periods may be shortened. Moreover, continuous cleaning and occasional or periodic dry cleaning may be used in combination.

Figure 3:
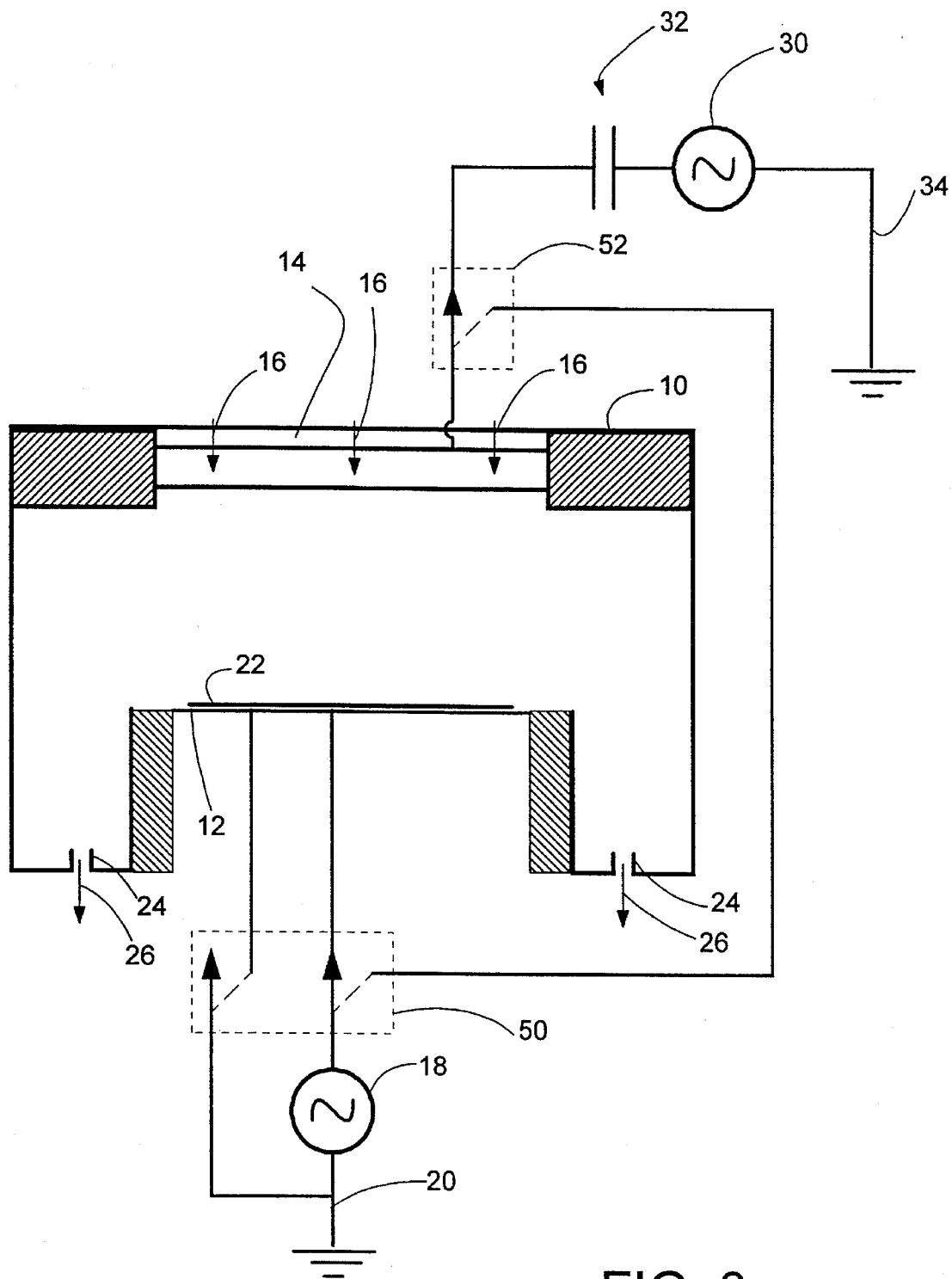
FIG. 3 is a diagrammatic view similar to FIG. 1, showing an alternative technique for applying power to the top electrode for cleaning.

FIG. 3 shows in simplified diagrammatic form how the two cleaning approaches may be implemented simultaneously, using rf switches 50 and 52. When the switches 50 and 52 are in the position shown by the arrows, the reactor is configured the same as in FIG. 1, with rf power supplied to the lower electrode 12 from one terminal of the primary rf generator 18, which has its other terminal grounded, and rf power supplied to the top electrode 14 through the capacitor 32, from one terminal of the separate rf generator 30, which also has its other terminal grounded. When the switches 50 and 52 are moved to their alternate positions, shown by broken lines, the separate rf generator 30 is disconnected from the top electrode 14 and power from the primary generator 18 is applied to the top electrode 14 only, for a periodic cleaning step not limited to the lower power of the separate rf generator. (In the alternate position, the lower electrode 12 is grounded.) Clearly, other approaches might well be employed. For example, the separate power supply 30 may be disconnected during normal etching operation, or the periodic cleaning rf power might be derived from the generator 30 rather from the generator 18.

The frequency of the additional rf generator 30 may, as discussed above, be considerably lower than that of the primary rf generator 18. Unlike the split power configuration referred to above, in which power is split evenly between the two electrodes and a phase difference of 180° is required, the present invention does not require that the frequencies of the rf power applied to the top and bottom electrodes to be the same and does not require a specific phase relationship between them.

The major benefit of the invention is that it always keeps the top electrode surface clean and free of polymer deposition. This ensures that a stable and repeatable plasma is generated and sustained in the chamber. Use of the invention reduces or eliminates the need for in situ dry cleaning, eliminates the current crowding effect, provides effective particle contamination control, and stabilizes etch performance. A further related advantage is that reduction or elimination of dry cleaning also lengthens the useful of life of process kits used in the chamber. In the case of oxide etching, the dry cleaning step uses an oxygen plasma, which readily attacks clamps, seals, O-rings and polyimide wafer chuck materials.

Other advantages of the invention depend on the type of etching operation performed in the chamber. If the top electrode is made of silicon, the oxide to silicon (or polysilicon) selectivity of etching is significantly improved because of a scavenging effect on free fluorine atoms in the chamber. Silicon in the electrode reacts with the fluorine and thus the electrode effectively consumes the free fluorine, leaving less fluorine to react with silicon in the substrate being etched. The result is improved selectivity, i.e. preferential etching of the oxide on the workpiece, as opposed to the silicon. Since scavenging is dependent on the rate of reaction of silicon with free fluorine, it is critical not only to keep the electrode surface clean and free of polymer throughout the etch process, but also to control the reaction rate by varying rf power (the rf power level depends on the specific process being used), or temperature, or both. For polysilicon or silicon etching, the top electrode can be made of pure silicon or doped silicon for a similar effect. For metal etching, the top electrode can be made of pure aluminum to avoid any possible contamination in the form of sputtering of the electrode material onto the wafer being etched. Further, the small amount of rf power applied to the top electrode will prevent the formation of aluminum oxide.

It will be appreciated from the foregoing that the present invention represents a significant advance in the field of reactive ion etching. In particular, the invention provides a simple but highly effective way of reducing or eliminating polymer deposits on the top electrode in a reactive ion etching chamber. Although this invention has been tested and proven in a reactive ion etch chamber, such as the Applied Materials' Precision 5000 MxP MERIE, the principles of the invention are also applicable to other plasma etchers, such as Applied Materials' inductive etcher (the High Density Plasma Omega, an inductively enhanced reactive ion etcher (described in copending application Ser. No. 07/941,507, filed on Sep. 8, 1992), any conventional RIE etcher, other magnetron etchers, such as TEL's 8500s, and Lam Triode system. Use of the invention reduced or eliminates the need for off-line dry cleaning and greatly reduces particulate contamination of wafers being processed in the chamber. It will also be appreciated that, although specific embodiments of the invention have been described in detail, various modifications may be made without departing from the spirit and scope of the invention. Accordingly, the invention should not be limited except as by the appended claims.

We claim:

1. A method of operation of a plasma etch reactor having first and second electrodes supporting the plasma, the method comprising the steps of:

supplying process gases to a plasma etch reactor chamber;

supplying high-frequency power to the second electrode in the chamber, in support of a plasma in the chamber; and pumping used process gases from the chamber; and applying high-frequency power to the first electrode simultaneously with the step of supplying high-frequency power to the second electrode, to clean deposits from the first electrode and to reduce or eliminate the need for off-line dry cleaning of the first electrode.

2. A method as defined in claim 1, and further comprising the steps of:

connecting power to the first electrode from a separate high-frequency power source of any selected frequency and of substantially lower power than is used to supply power to said one electrode;

and wherein the power applied to the first electrode increases ion energy in the plasma and is selected to produce continuous cleaning of deposits from the first electrode without significant removal of electrode material.

3. The method of claim 1, in which the high-frequency power supplied to the first electrode to clean deposits is of a significantly lower frequency than the high-frequency power supplied to the second electrode.

4. The method of claim 1, in which the second electrode is supplied by one output of a first high-frequency source, with the other output of said first high-frequency source being grounded; and the first electrode is supplied by one output of a second high-frequency source through a capacitance, with the other output of said second high-frequency source being grounded.

5. The method of claim 4, which includes the further step of electrically isolating both the first and second electrodes from the walls of the chamber prior to supplying said high-frequency power.

6. The method of claim 1, in which the high-frequency power in support of the plasma is of a first high frequency applied between the second electrode and ground, and the first electrode is grounded via a capacitance chosen to exhibit low impedance to the first high frequency.

7. A method of plasma processing of substrates in a reactor having a pair of spaced electrodes, comprising the steps of:

establishing a plasma within the reactor to process a substrate within the reactor and supplying high-frequency power to one electrode in support of said plasma; and simultaneously supplying high-frequency power to the other electrode to clean deposits therefrom, so that processing downtime for electrode cleaning is reduced or eliminated;

wherein the high-frequency power supplied to said other electrode to clean deposits is of a significantly lower frequency than the high-frequency power supplied to said one electrode;

and wherein the power for cleaning of deposits is increased periodically.

8. The method of claim 7, in which the power in support of the plasma is periodically reduced during the times at which the power for cleaning of deposits is increased.

9. A plasma etch reactor, comprising:

a reactor chamber;

an upper electrode located in the chamber;

a lower electrode spaced apart from the first electrode, for supporting a workpiece to be processed in the reactor chamber;

at least one inlet port for supplying process gases to the reactor chamber;

at least one outlet port for evacuating gases from the chamber;

a high-frequency power source connected between the lower electrode and ground, to generate and sustain a plasma in the reactor chamber; and a second high-frequency power source of much lower power than the first-recited high-frequency power source and a circuit for connecting the second high-frequency power source to the upper electrode while the plasma etch reactor is in normal operation and is receiving power from the first recited high-frequency power source;

wherein the second high-frequency power source performs continuous cleaning of the upper electrode during normal operation and periodic additional cleaning may be performed by applying power to the upper electrode only.

* * * * *